United States Patent
Yang et al.

(10) Patent No.: US 11,008,481 B1
(45) Date of Patent: May 18, 2021

(54) POLYMER BRUSH REFLOW FOR DIRECTED SELF-ASSEMBLY OF BLOCK COPOLYMER THIN FILMS

(71) Applicants: Seagate Technology LLC, Cupertino, CA (US); Board of Regents The University of Texas System, Austin, TX (US)

(72) Inventors: Xiaomin Yang, Livermore, CA (US); Austin Patrick Lane, Austin, TX (US); Michael Joseph Maher, Minneapolis, MN (US); Gregory Blachut, San Jose, CA (US)

(73) Assignee: Seagate Technology LLC, Fremont, CA (US)

( * ) Notice: Subject to any disclaimer, the term of this patent is extended or adjusted under 35 U.S.C. 154(b) by 184 days.

(21) Appl. No.: 15/991,000

(22) Filed: May 29, 2018

Related U.S. Application Data (60) Provisional application No. 62/512,812, filed on May 31, 2017.

(51) Int. Cl.
| | | |
|---|---|---|
| C09D 183/10 | (2006.01) | |
| G03F 7/00 | (2006.01) | |
| B82Y 40/00 | (2011.01) | |
| G03F 7/16 | (2006.01) | |
| B82Y 10/00 | (2011.01) | |
| B81C 1/00 | (2006.01) | |

(52) U.S. Cl.
CPC ......... *C09D 183/10* (2013.01); *G03F 7/0002* (2013.01); *B81C 1/00031* (2013.01); *B82Y 10/00* (2013.01); *B82Y 40/00* (2013.01); *G03F 7/16* (2013.01)

(58) Field of Classification Search
CPC ....... C09D 183/10; G03F 7/0002; G03F 7/16; B81C 1/00031; B82Y 10/00; B82Y 40/00
See application file for complete search history.

(56) References Cited

U.S. PATENT DOCUMENTS

| | | | |
|---|---|---|---|
| 8,821,978 B2 | 9/2014 | Cheng et al. | |
| 2001/0056144 A1* | 12/2001 | Lamb, III | H01L 21/312 524/377 |
| 2010/0124638 A1* | 5/2010 | Xiao | B81C 1/00031 428/195.1 |
| 2011/0147984 A1* | 6/2011 | Cheng | B82Y 10/00 264/220 |

(Continued)

*Primary Examiner* — James M Mellott
(74) *Attorney, Agent, or Firm* — Mueting Raasch Group (57) ABSTRACT

A method comprises forming a first structured pattern having a first line width on a substrate. A polymer brush is deposited on the structured pattern, which is annealed a first time at a first temperature and then annealed a second time at a second temperature higher than the first temperature. A block copolymer is deposited on the structured pattern and polymer brush, and aligned first block and second block structures are formed on the structured pattern and polymer brush. The first block structures and portions of the polymer brush and the structured pattern positioned beneath the first block structures are removed, and the substrate between the second block structures is exposed. The second block structures are then removed to form a second structured pattern in the substrate having a second line width, the second line width being smaller than the first line width.

20 Claims, 6 Drawing Sheets

(56) References Cited

U.S. PATENT DOCUMENTS

| | | | |
|---|---|---|---|
| 2012/0107583 A1* | 5/2012 | Xiao | G03F 7/0002 |
| | | | 428/210 |
| 2013/0209757 A1* | 8/2013 | Willson | B29C 43/32 |
| | | | 428/195.1 |
| 2013/0266727 A1 | 10/2013 | Peeters et al. | |
| 2016/0351449 A1* | 12/2016 | Bristol | H01L 21/31127 |

* cited by examiner

POLYMER BRUSH REFLOW FOR DIRECTED SELF-ASSEMBLY OF BLOCK COPOLYMER THIN FILMS

RELATED APPLICATIONS

This application claims the benefit of Provisional Patent Application Ser. No. 62/512,812 filed on May 31, 2017, to which priority is claimed pursuant to 35 U.S.C. § 119(e) and which is hereby incorporated herein by reference in its entirety.

SUMMARY

Embodiments discussed herein involve a method of directed self-assembly that forms patterns with dimensions at or below ten nanometers. The method includes forming a first structured pattern having a first line width on a substrate. A polymer brush is deposited on the structured pattern. The polymer brush is annealed at a first temperature and then again at a second temperature where the second temperature is higher than the first temperature. A block copolymer layer is deposited on the structured pattern and polymer brush and aligned first block structures and second block structures are formed on the structured pattern and polymer brush. The first block structures, portions of the polymer brush positioned beneath the first block structures, and portions of the structured pattern positioned beneath the first block structures are removed. The substrate between the second block structures is exposed, and the second block structures are removed to form a second structured pattern in the substrate having a second line width. The second line width is smaller than the first line width.

Additional embodiments further include depositing a second polymer brush, after annealing the first polymer brush at the second temperature. The second polymer brush is annealed at a third temperature, where the third temperature is higher than the second temperature.

DETAILED DESCRIPTION

Directed self-assembly (DSA) is a nanofabrication technique that is both high-volume and cost-effective. DSA refers to the integration of self-assembling materials with traditional manufacturing processes. The self-assembling properties of materials are used to reach nanoscale dimensions using current manufacturing processes and equipment. In particular, block copolymer films are used in DSA on lithographically defined chemically nanopatterned surfaces. The self-assembly can be directed to form a number of pattern geometries involving, for example lines and/or hole patterns. Moreover, block copolymers show a tendency to repair defects in patterns made using traditional photolithographic techniques by filling in gaps missing within patterns already on a surface. Block copolymer materials self-assemble to form densely packed features with uniform dimensions and shapes in ordered arrays at a scale of tens of nanometers.

While various DSA methods have been proposed, directed self-assembly of block copolymers at a resolution of ten nanometers or less is challenging. At this scale, it is difficult to produce a chemically modified pre-pattern surface for the directed self-assembly. For example, using a polymer brush process can result in the polymer brush grafting everywhere—on both the trenches and the tops of the oxidized imprint lines. This creates very weak, or even no, chemical contrast on the pattern. To obtain pattern dimensions less than ten nanometers, embodiments described herein involve using selective polymer grafting chemistry only into the trenches of imprint lines of topographical patterns generated through imprint lithography. In certain embodiments, the polymer is grafted only in the trenches by using a polymer brush reflow process. The thermal polymer brush reflow process creates chemical contrast patterns for directed self-assembly with dimensions of about five nanometers. These processes, in turn, can be used to nanoimprint masters to manufacture bit patterned media at storage densities greater than 2 Tb/in$^2$ and integrated circuits with minimum feature sizes of about five nanometers.

Figure 1A:
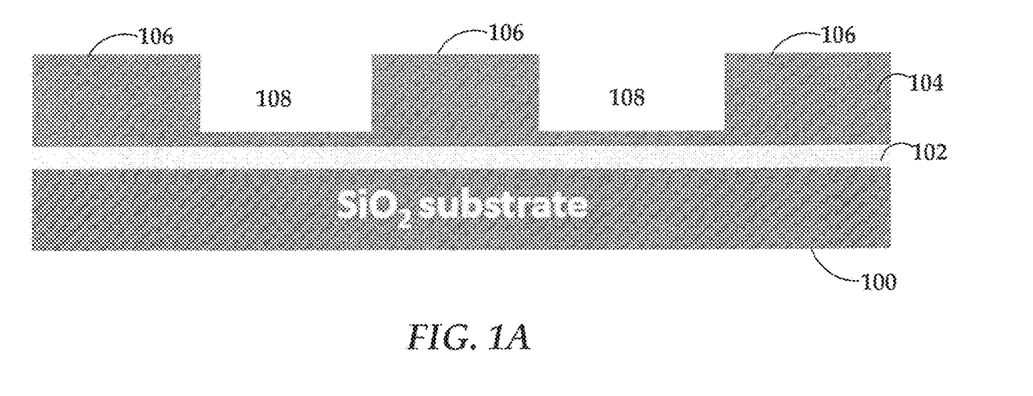
FIGS. 1A-I illustrate overall processes of directed self-assembly using a polymer brush according to embodiments discussed herein.

Processes for directed self-assembly using block copolymers are illustrated in FIGS. 1A-I. Since these figures describe one or more subsequent steps in an overall DSA process, similar reference numerals are used throughout FIGS. 1A-I to refer to the same features, even if all reference numerals are not included in each figure illustrating the features. In FIG. 1A, a substrate 100 has a thin layer 102 deposited thereon. The substrate 100 can be a variety of materials including silicon, quartz (e.g., SiO$_2$), and silicon nitride, and the thin layer 102 (e.g., about 2-5 nm thick) can be a chromium layer such as chromium, chromium oxide, and/or chromium nitride. Using a variety of techniques, one or more pre-patterns 104, or structures, are fabricated on the substrate 100 for block copolymer directed self-assembly. For example, the first structured pattern can be a lithographically imprinted resist pattern, a deep ultraviolet resist, e-beam resist, formed using 193 nm patterning immersion lithography, extreme ultraviolet resist, etc. The pattern is also not limited to resist and may comprise other materials such as carbon, polydimethylsiloxane (PDMS), etc. In certain embodiments, the pre-pattern 104 can include various features including lines 106 and trenches 108 formed between lines 106. The imprint lines 106 and spacing widths can be changed depending on the natural periodicity of the block copolymer and on the desired density multiplication for the process. The density multiplication refers to the number of block copolymer features that can be aligned for every pre-patterned structure. For example, if the selected block copolymer has a natural periodicity of 10 nm, then the line width spacing can be adjusted to 40 nm to accommodate four block copolymer lines per guide stripe.

Figure 1B:
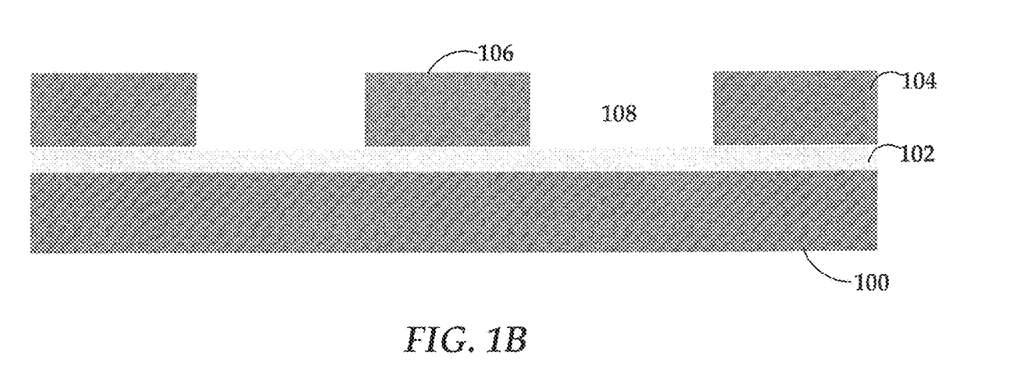

In FIG. 1B, the residual imprint resist is removed from between the imprint lines 106 (e.g., from within the trenches 108). Removal of the resist from the trenches 108 using a breakthrough etch also decreases the height and width of the imprint lines 106. The etch is an oxygen (e.g., O$_2$) reactive ion etch, which also oxidizes the surface of the imprint lines 106 and the exposed chromium film 102. The oxidation facilitates polymer brushes grafting to these surfaces.

Figure 1C:
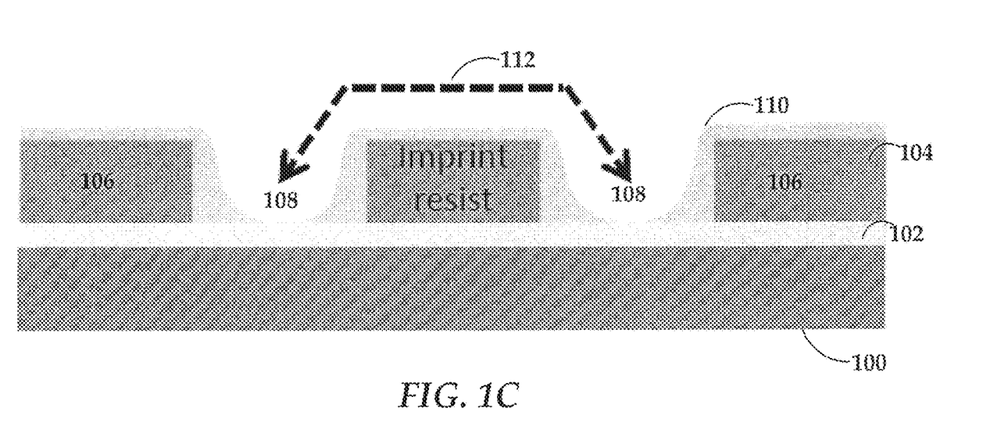
Figure 1D:
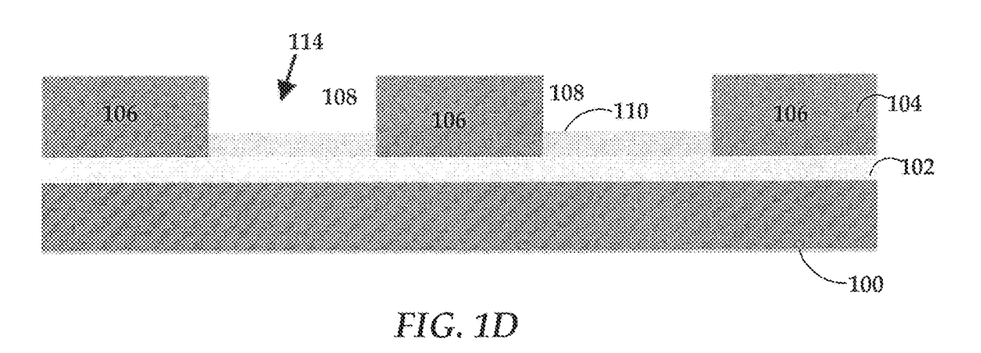

Deposition of a polymer brush 110 is illustrated in FIG. 1C. A polymer brush is an array of polymer molecules where each molecule is tethered to a common surface—a thin film surface coating of polymers stretched away from the common grafting surface. The composition of the deposited polymer brush 110 can be tailored to be polar, non-polar, or neutral for the block copolymer, depending on the size of the guiding pattern and the strategy for pattern transfer. A polymer brush provides the proper surface energy for the substrate/sample surface to stabilize a perpendicular orientation of the block copolymer. For high quality directed self-assembly, it is important that the brush polymer only graft to the interspaces between the guiding pattern lines. If the surface of the imprint patterns becomes polluted with the polymer brush material, the guiding patterns cannot preferentially interact with one block of the block copolymer to guide alignment. Example polymer brushes 110 include hydroxyl-terminated polymers synthesized by anionic polymerization or controlled radical polymerization techniques such as atom transfer radical polymerization (ATRP), reversible addition-fragmentation chain-transfer polymerization (RAFT), or nitroxide-mediated polymerization (NMP). Also, the polymer brush 110 may be spin-coated from a dilute solution (e.g., 0.1 wt %) at high speeds (e.g., 3000-5000 rpm) to keep the polymer brush 110 film as thin as possible (e.g., 2-3 nm). After the polymer brush 110 is deposited on the pre-patterned imprint resist 104 (including on lines 106 and in trenches 108), the polymer brush 110 is annealed 112 at a first temperature of about 130-160° C. (e.g., 150° C.) for about 2-10 minutes (e.g., 10 minutes). This first annealing step provides mobility for the polymer brush 110 to flow away from the imprint lines 106 and onto/into the trenches 108 as shown in FIG. 1D. Next, the polymer brush undergoes a second annealing step 114 at a temperature higher than that of the first anneal. For example, the second anneal is at a second temperature of about 180-250° C. (e.g., 250° C.) for about 5-10 minutes (e.g., 5 minutes). The second, higher temperature anneal assists the polymer brush 110 in grafting to the oxidized chromium substrate in the trenches 108. After the second anneal 114, the sample is rinsed (e.g., using methyl isobutyl ketone) to remove excess, ungrafted, polymer brush 110. The annealing steps are performed in air on open hotplates.

Figure 1E:
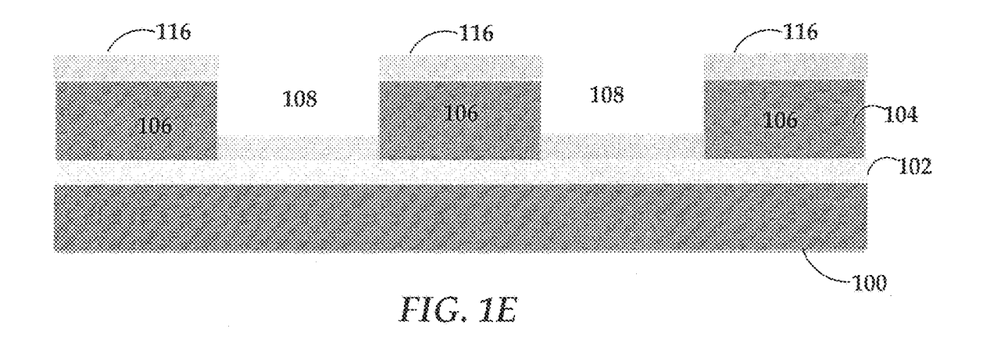

FIG. 1E illustrates an optional process in the directed self-assembly. A second polymer brush 116 may be deposited to graft to the imprint lines 106 since the first polymer brush 110 reflowed into and saturated the trenches 108 after being deposited and annealed. The second polymer brush process may be implemented depending upon the block copolymer being used for the directed self-assembly. The sample including the second polymer brush 116 is then annealed at a temperature of about 180-250° C. (e.g., 250° C.) for about 5-10 minutes (e.g., 5 minutes). After annealing the second polymer brush 116, the sample is rinsed (e.g., using methyl isobutyl ketone) to remove excess, ungrafted, polymer brush 116. Example polymer brushes 116 for use as a second polymer brush include hydroxyl-terminated polymers synthesized by anionic polymerization or controlled radical polymerization techniques such as atom transfer radical polymerization (ATRP), reversible addition-fragmentation chain-transfer polymerization (RAFT), or nitroxide-mediated polymerization (NMP).

Figure 1F:
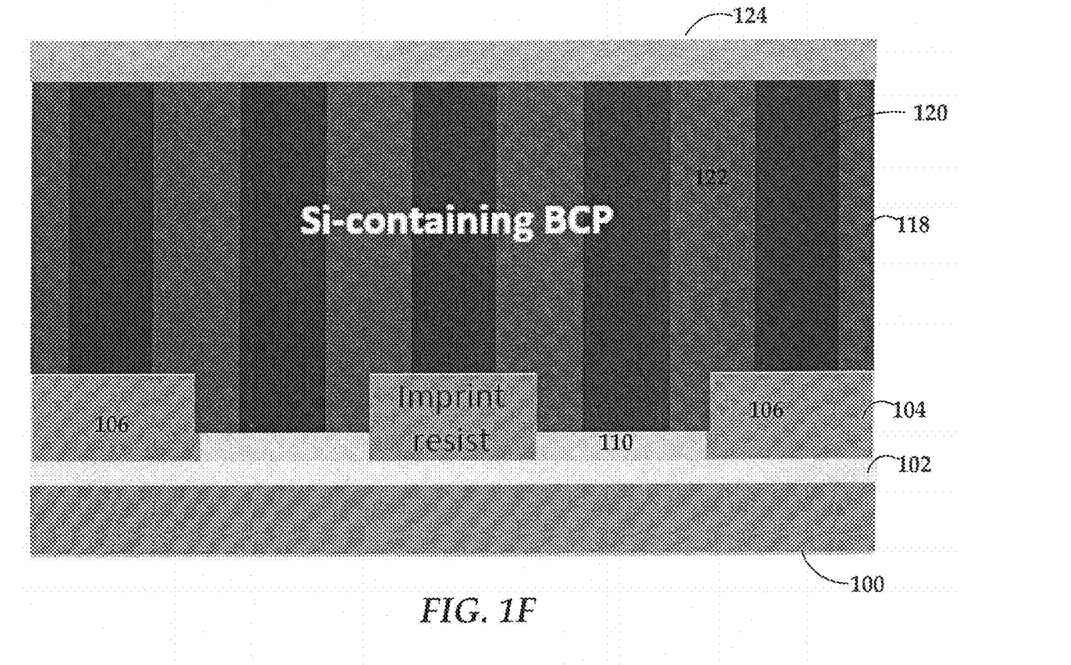

Following the deposition of one, or more, polymer brushes, directed self-assembly of a block copolymer is illustrated in FIG. 1F. A block copolymer thin film 118 is first deposited on the sample. In certain embodiments, the block copolymer contains silicon functional groups and is deposited by spin coating. Example block copolymers are styrenic material containing silicon functional groups, such as poly(5-vinyl-1,3-benzodioxole-block-pentamethyldisilylstyrene), poly(styrene-block-trimethylsilylstyrene), and poly(4-methoxystyrene-block-trimethylsilylstyrene). A polymeric top coat 124 is then deposited over the block copolymer thin film 118. Example materials for the top coat 124 include random copolymers of maleic anhydride and styrene derivatives, including 4-tert-butylstyrene and 3,5-ditert-butylstyrene. When reacted with aqueous base, the top coat can be dissolved in orthogonal spin coating solvents such as water or methanol. Once coated on top of the block copolymer film, the top coat can be annealed at high temperatures to create a non-preferential surface that facilitates perpendicular orientation of the block copolymer. The sample is annealed at a temperature of about 180-210° C. (e.g., greater than about 180° C.) for about 2-30 minutes (e.g., 10 mins) to generate aligned block copolymer structures 120, 122 on the substrate. As shown, the silicon containing portion of the copolymer forms blocks 120 in a vertically oriented lamellar structure with blocks 122 of the organic portion of the copolymer. The annealing prompts the portions of the copolymer thin film 118 to segregate, and align, into their respective blocks 120, 122. While a lamellar line pattern with a vertical orientation is illustrated, in other embodiments, the block copolymer can form spherically and/or cylindrically aligned structures. Regardless of the shape of the structures, the spacing between the structures may be referred to as the line width.

Figure 1G:
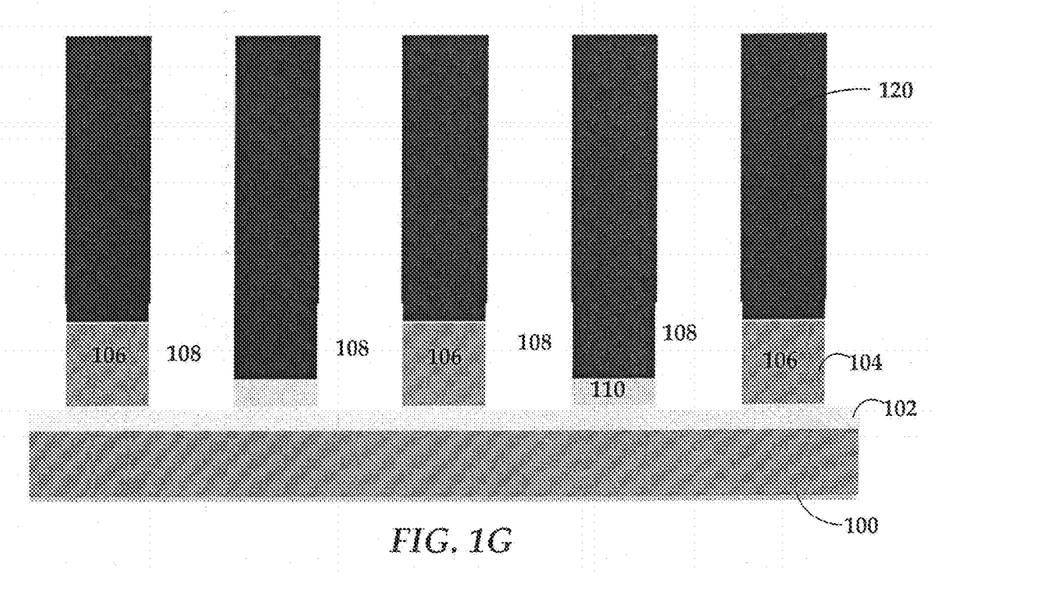

The creation of a block copolymer line pattern is shown in FIG. 1G. To create the line pattern, the top coat 124 is removed. This may be done by reactive ion etching, such as with oxygen reactive ion etching, or by wet development using aqueous base. The organic blocks 122 are also selectively removed from the block copolymer film 118. This is done through oxygen (e.g., $O_2$) reactive ion etching to develop the block copolymer pattern. Further oxygen (e.g., $O_2$) reactive ion etching is performed to etch through the trenches 108. This involves removing organic imprint resist and polymer brush 110 exposed in the trenches after removal of the organic blocks 122 of the block copolymer film 118. The removal of the non-silicon containing block and the residual imprint/brush material can be accomplished in the same etch step, or removed in separate etch processes to improve subsequent pattern transfer. After etching, the silicon containing blocks 120 remain to form the block copolymer line patterns. As shown, the block copolymer line pattern has an increased number of structures as compared with the imprint resist pre-pattern (5 vs. 3) in the same area of substrate. The dimensions of the block copolymer pattern are smaller than those of the original pre-pattern.

Figure 1H:
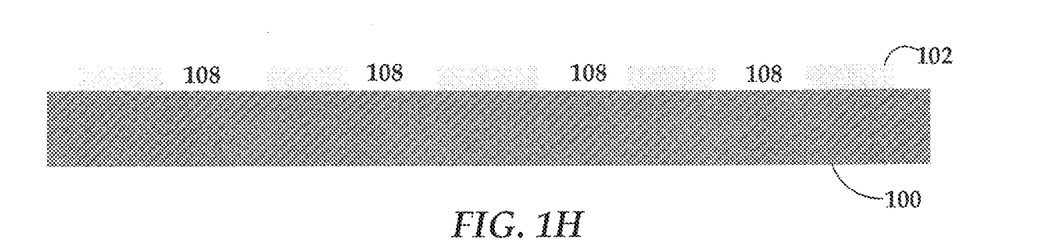
Figure 1I:
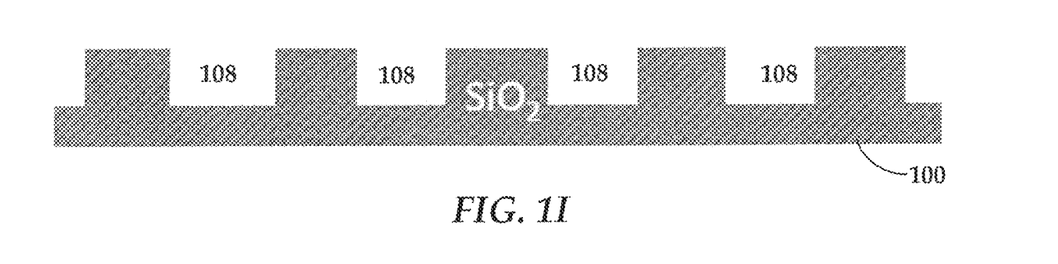

In FIG. 1H, the rest of the block copolymer film 118 is removed. The block copolymer pattern is etched into the chromium layer 102. This can be performed with a chlorine (e.g., $Cl_2$) reactive ion etch. This etch not only removes the silicon containing blocks 120 but any remaining resist lines 106 and polymer brush 110. Next, FIG. 1I shows transfer of the chromium pattern into the substrate 100. This can be performed with a fluoroform (e.g., $CHF_3$) reactive ion etch. Transfer of the line pattern into the substrate 100 forms a template having much smaller dimensioned features than those of the original resist pre-pattern 104. For example, if the pitch of the original resist pre-pattern 104 is $L_{resist}$ and the pitch of the block copolymer material's natural pattern is $L_{BCP}$, then $L_{resist}=nL_{BCP}$, where n is an integer with a value greater than 1, such as n=2, 3, 4, etc. Thus, the block copolymer material has much smaller dimensions than the resist pre-pattern and establishes the dimensions for the template. The resist pre-pattern is used as a guiding pattern for the directed self-assembly, and the final pattern pitch is determined by the block copolymer pattern.

Figure 2:
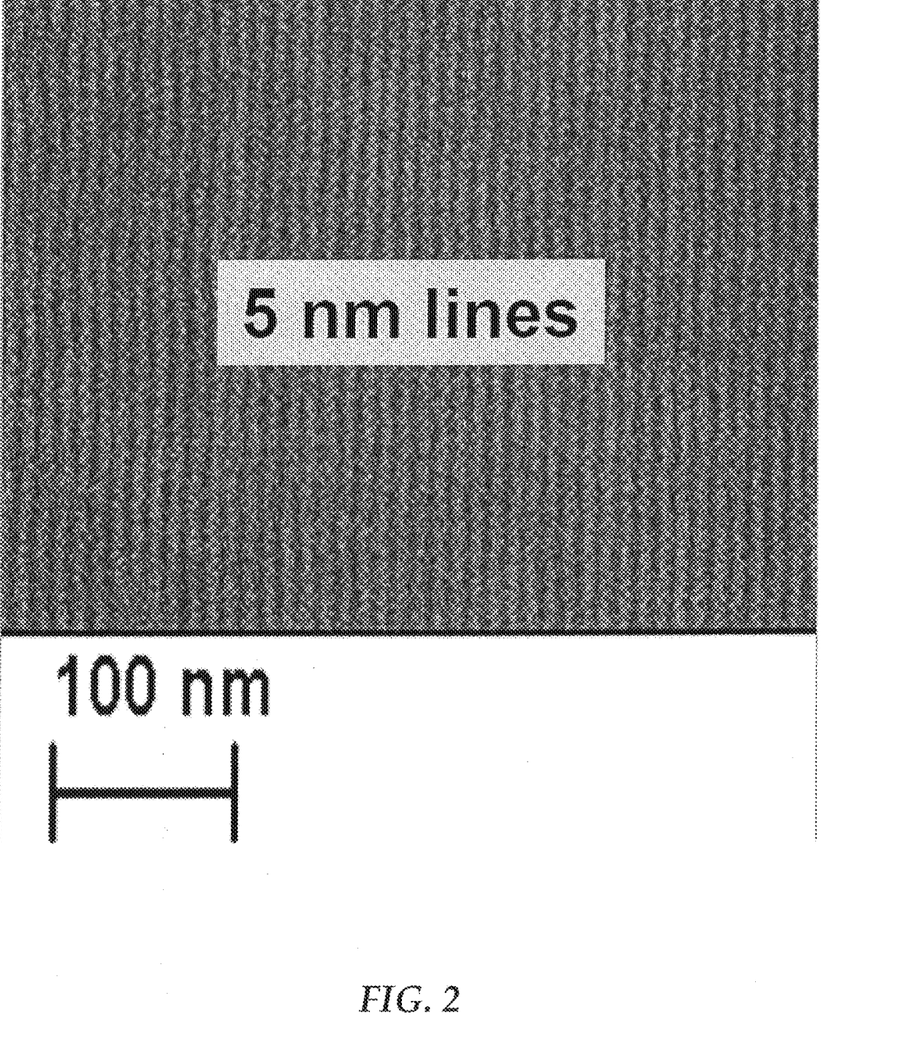
FIG. 2 shows a SEM image of a guided ten nanometer full-pitch block copolymer line pattern.

The above-described processes produce nanostructures with dimensions of about ten nanometers or less. An example patterned structure is illustrated in the scanning electron microscope (SEM) image of FIG. 2. The SEM image is of a guided self-assembly of a ten nanometer full-pitch block copolymer line pattern. The scale identifying a dimension of one hundred nanometers indicates that the imprint resist pattern pitch is five times the block copolymer pattern pitch. Line patterns with these dimensions can be used to manufacture lithographically-defined magnetic islands for bit-patterned media, or critical device structures for integrated circuits on length scales of 4-10 nm.

Figure 3:
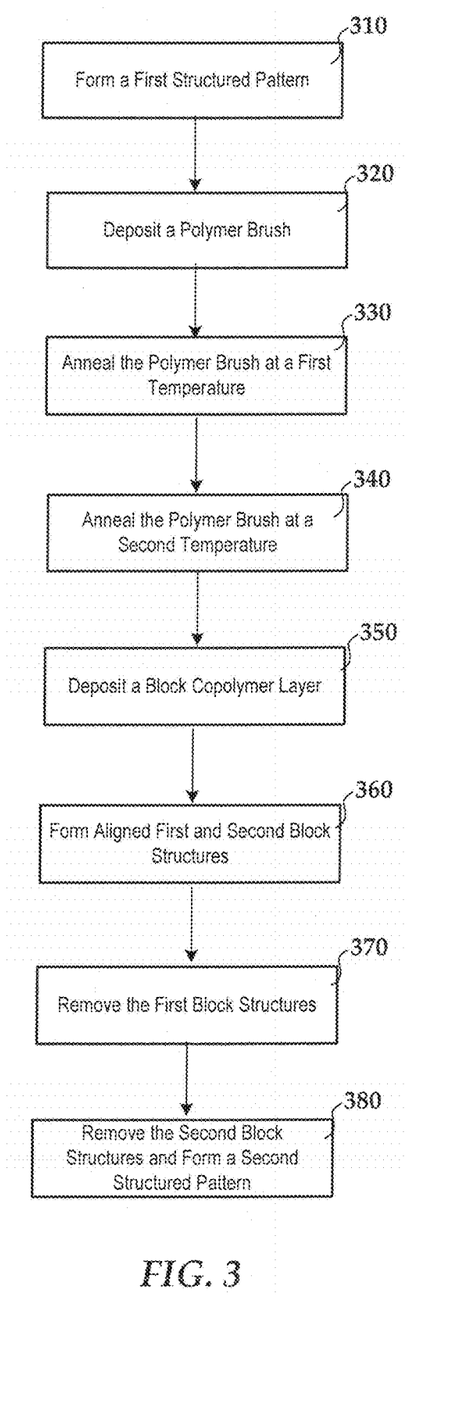
FIG. 3 is a flow diagram illustrating a process of directed self-assembly using a polymer brush, according to some embodiments.

FIG. 3 further illustrates a flow chart of a method of directed self-assembly that forms patterns with dimensions at or below ten nanometers. The method involves forming a first structured pattern having a first line width on a substrate 310. The first structured pattern can be a lithographically imprinted resist pattern, a deep ultraviolet resist, e-beam resist, formed using 193 nm patterning immersion lithography, extreme ultraviolet resist, etc. The pattern is also not limited to resist and may comprise other materials such as carbon, polydimethylsiloxane (PDMS), etc. A polymer brush is deposited on the first structured pattern 320. The polymer brush undergoes a mild anneal at a first temperature to mobilize the polymer brush 330. This allows the polymer brush to flow from atop the lines of the first pattern into the trenches of the pattern and onto the substrate or a grafting layer disposed on the substrate. The polymer brush is then annealed again at a second, higher temperature 340. This anneal step assists in grafting the polymer brush to the substrate/grafting layer disposed on the substrate. A block copolymer, for example one containing silicon, is then deposited on the sample 350 covering the first structured pattern and the polymer brush in the trenches of the pattern. First and second block structures are formed, and aligned, in the block copolymer layer 360. This may be accomplished by annealing the block copolymer at a temperature greater than 180° C. for about 10-30 minutes. The first block structures, e.g. the organic component of the block copolymer, are removed along with portions of the polymer brush and the first structured pattern positioned beneath the first block structures 370 to expose the substrate between the second block structures, e.g., the silicon component. Removal of the second block structures transfers/forms a second structured pattern in the substrate having a line width smaller than the line width of the first structured pattern 380. The second structured pattern may be used as a template for creating various electronic devices including integrated circuits and bit patterned media having aerial densities greater than 2 Tb/in$^2$.

It is to be understood that even though numerous characteristics of various embodiments have been set forth in the foregoing description, together with details of the structure and function of various embodiments, this detailed description is illustrative only, and changes may be made in detail, especially in matters of structure and arrangements of parts illustrated by the various embodiments to the full extent indicated by the broad general meaning of the terms in which the appended claims are expressed.

What is claimed is:

1. A method, comprising:
    forming a first structured pattern including lines and trenches between the lines and having a first line width on a substrate;
    depositing a polymer brush on the first structured pattern;
    annealing the polymer brush at a first temperature and flowing the polymer brush away from the lines and into the trenches;
    annealing the polymer brush at a second temperature, the second temperature being higher than the first temperature;
    depositing a block copolymer layer on the first structured pattern and polymer brush;
    forming aligned first block structures and second block structures on the first structured pattern and polymer brush;
    removing the first block structures and portions of the polymer brush and the first structured pattern positioned beneath the first block structures and exposing the substrate between the second block structures; and
    removing the second block structures and forming a second structured pattern in the substrate having a second line width, the second line width being smaller than the first line width.

2. The method of claim 1, wherein forming the first structured pattern comprises lithographically imprinting the first structured pattern.

3. The method of claim 1, further comprising:
    depositing a layer of chromium on the substrate before forming the first structured pattern.

4. The method of claim 1, further comprising:
    depositing a second polymer brush, after annealing the polymer brush at the second temperature; and
    annealing the second polymer brush at a third temperature.

5. The method of claim 1, further comprising:
    depositing a top coat layer over the block copolymer layer before forming the aligned first block and second block structures.

6. The method of claim 5, further comprising:
    removing the top coat layer after forming the aligned first block structures and second block structures.

7. The method of claim 1, wherein the block copolymer contains silicon.

8. The method of claim 1, wherein the second block structures contain silicon.

9. The method of claim 1, wherein the first temperature is 130 to 160° C.

10. The method of claim 1, wherein the second temperature is 180 to 250° C.

11. The method of claim 1, wherein the block copolymer is a styrenic material containing silicon functional groups.

12. The method of claim 1, wherein forming aligned first block and second block structures on the structured pattern and polymer brush comprises annealing the block copolymer layer at a temperature greater than 180° C. for 10-30 minutes.

13. A method, comprising:
    lithographically imprinting a first structured pattern including lines and trenches between the lines and having a first line width on a substrate;
    etching the structured pattern using 02;
    depositing a polymer brush on the structured pattern;
    annealing the polymer brush at a first temperature and flowing the polymer brush away from the lines and into the trenches;
    annealing the polymer brush at a second temperature, the second temperature being higher than the first temperature;
    depositing a block copolymer layer on the structured pattern and polymer brush;

forming aligned first block structures and second block structures on the structured pattern and polymer brush;

removing the first block structures and portions of the polymer brush and the structured pattern located beneath the first block structures;

exposing the substrate between the second block structures; and removing the second block structures to form a second structured pattern in the substrate having a second line width, the second line width being smaller than the first line width.

14. The method of claim 13, further comprising:
depositing a layer of chromium on the substrate before imprinting the first structured pattern.

15. The method of claim 13, wherein the second temperature is about 180 to 250° C.

16. The method of claim 13, wherein the second block structures contain silicon.

17. The method of claim 13, wherein forming aligned first block and second block structures on the structured pattern and polymer brush comprises annealing the block copolymer layer at a temperature greater than 180° C. for 10-30 minutes.

18. A method, comprising:
lithographically imprinting a first structured pattern including lines and trenches between the lines and having a first line width on a substrate;
etching the structured pattern using $O_2$;
depositing a polymer brush on the structured pattern;
annealing the polymer brush at a first temperature and flowing the polymer brush away from the lines and into the trenches;
annealing the polymer brush at a second temperature, the second temperature being higher than the first temperature;
depositing a second polymer brush on the first polymer brush;
annealing the second polymer brush at a third temperature;
depositing a block copolymer layer on the structured pattern and second polymer brush;
forming aligned first block structures and second block structures on the structured pattern and second polymer brush;
removing the first block structures and portions of the first polymer brush, second polymer brush, and the structured pattern located beneath the first block structures;
exposing the substrate between the second block structures; and
removing the second block structures to form a second structured pattern in the substrate having a second line width, the second line width being smaller than the first line width.

19. The method of claim 18, wherein the first temperature is 130 to 160° C.

20. The method of claim 18, wherein the third temperature is 180 to 250° C.

* * * * *